(12) United States Patent
Hsieh et al.

(10) Patent No.: US 8,545,110 B2
(45) Date of Patent: Oct. 1, 2013

(54) ELECTRICAL SOCKET HAVING OPTICAL MODULE

(75) Inventors: Wen-Yi Hsieh, New Taipei (TW); Yen-Chih Chang, New Taipei (TW); Shih-Wei Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 128 days.

(21) Appl. No.: 13/165,799

(22) Filed: Jun. 22, 2011

(65) Prior Publication Data

US 2012/0076461 A1   Mar. 29, 2012

(30) Foreign Application Priority Data

Sep. 23, 2010 (TW) .................................. 99218326

(51) Int. Cl.
*G02B 6/36* (2006.01)
*G02B 6/42* (2006.01)
*H01R 13/66* (2006.01)

(52) U.S. Cl.
USPC .......................... 385/89; 385/93; 439/620.15

(58) Field of Classification Search
USPC ........................................................ 385/89, 93
See application file for complete search history.

(56) References Cited

U.S. PATENT DOCUMENTS

| 3,777,154 A | * | 12/1973 | Lindsey | 250/227.11 |
| 5,230,030 A | * | 7/1993 | Hartman et al. | 385/50 |
| 7,366,375 B2 | * | 4/2008 | Ohtorii | 385/33 |
| 2011/0255832 A1 | * | 10/2011 | Zhao et al. | 385/88 |

* cited by examiner

*Primary Examiner* — Omar Rojas
(74) *Attorney, Agent, or Firm* — Wei Te Chang; Ming Chieh Chang

(57) ABSTRACT

An electrical socket (100) comprises an insulative housing (1) and an optical module (3) arranged on the insulative housing (1), the insulative housing (1) comprises a plurality of electrical contacts (2) received therein to transmit electrical signal, the optical module (3) comprises a plurality of optical members (4) to transmit optical signal.

20 Claims, 8 Drawing Sheets

ELECTRICAL SOCKET HAVING OPTICAL MODULE

BACKGROUND OF THE INVENTION

1. Field of the Invention

The present invention relates to an electrical socket, and more particularly to an electrical socket having optical members for transmitting optical signal.

2. Description of the Prior Art

A conventional electrical connector for electrically connecting an IC package to a printed circuit board comprises an insulative housing and a plurality of contacts received therein to transmit signal and electrical current. The insulative housing comprises a bottom wall and sidewalls extending upwardly from the bottom wall. The bottom wall comprises a top surface and a bottom surface opposite to the top surface. The contacts are made of metal and each comprises a body portion, a contact portion extending beyond the top surface and a tail extending beyond the bottom surface. The body portion is positioned in the bottom wall to secure the contact in the insulative housing. The contact portion is used to contact with the pad of the IC package and the tail is used to contact with the pad of the printed circuit board. Thus, a good electrical connection is established between the IC package and the printed circuit board to transmit signal and electrical current.

The electrical connector becomes smaller and smaller and the number of the contacts becomes more and more. Thus, the heat produced by the electrical connector is increased accordingly. At the same time, the distance between the contacts becomes smaller which result in electromagnetic interference becomes more seriously.

Therefore, it is needed to find a new socket assembly to overcome the problems mentioned above.

SUMMARY OF THE INVENTION

Accordingly, an object of the present invention is to provide an electrical socket having optical module with plurality of optical members for transmitting optical signal.

In order to achieve the object set forth, an electrical socket comprises an insulative housing and an optical module received in the insulative housing, the insulative housing comprises a plurality of electrical contacts received therein to transmit electrical signal, the optical module comprises a plurality of optical members to transmit optical signal.

DESCRIPTION OF PREFERRED EMBODIMENT

Reference will now be made to the drawings to describe the present invention in detail.

Figure 1:
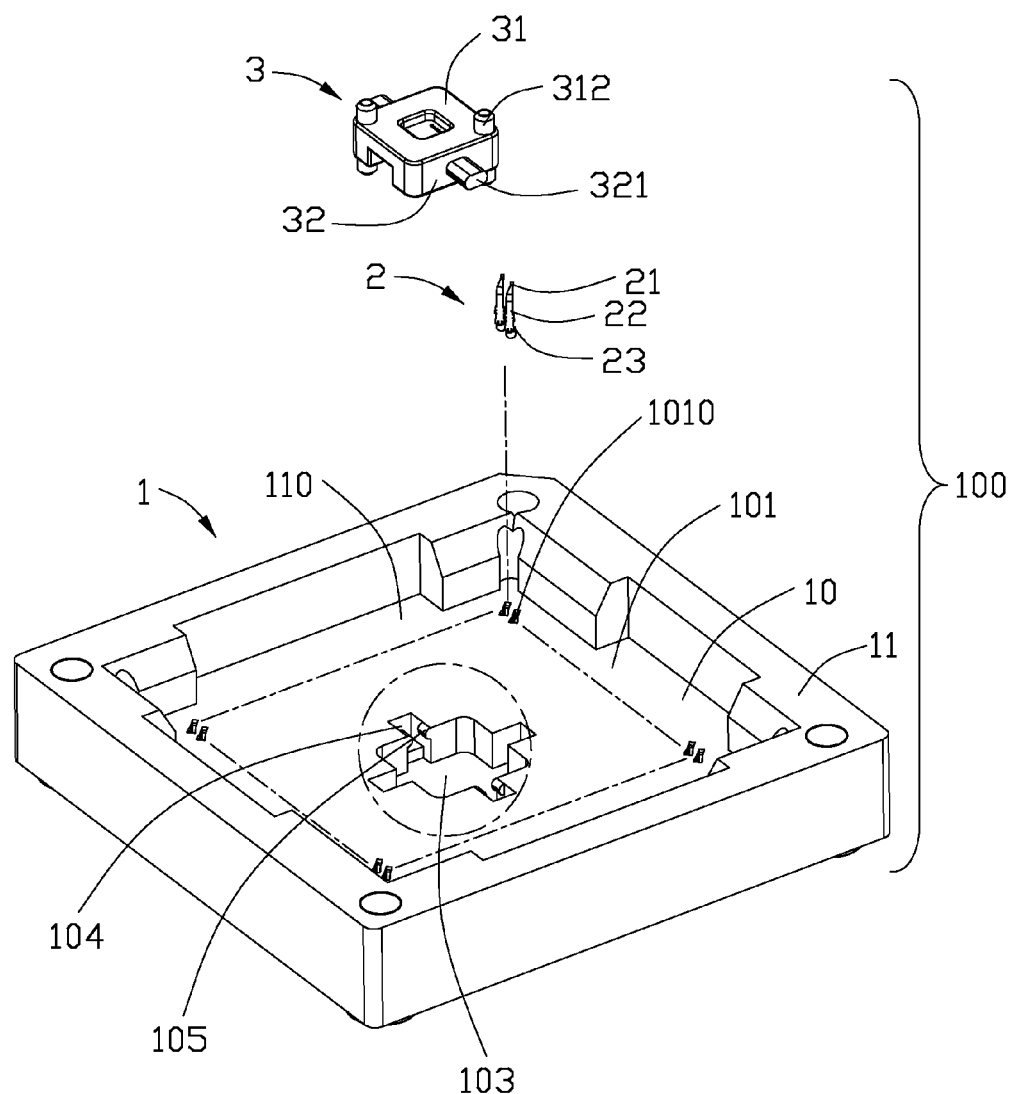
FIG. 1 is an exploded view of the electrical socket according to a preferred embodiment of the present invention.
Figure 2:
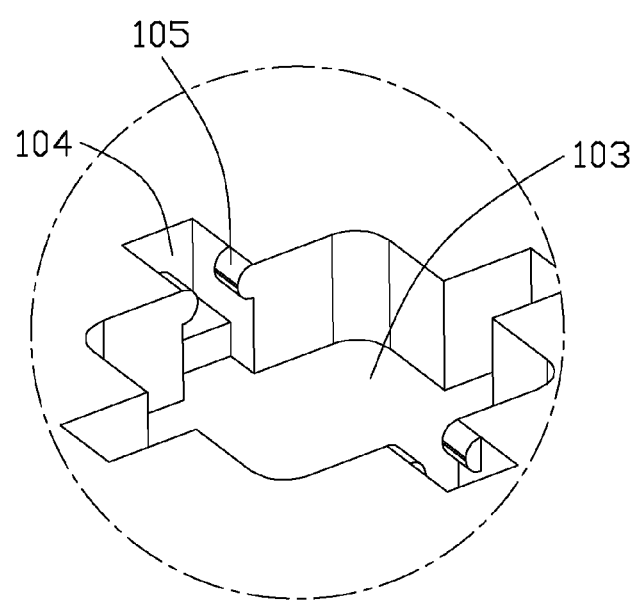
FIG. 2 is an enlarged view of the circle portion of FIG. 1.
Figure 6:
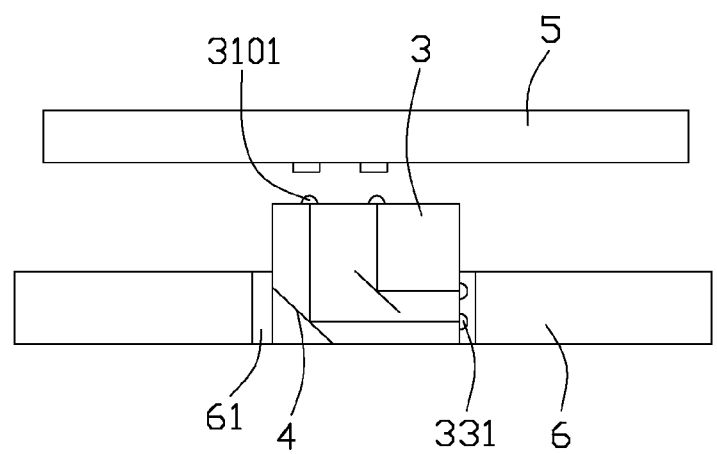
FIG. 6 is a sketch view showing the optical module connected to an IC package and a printed circuit board.

Referring to FIG. 1 and FIG. 6, an electrical socket 100 is used to connecting an IC package 5 to a printed circuit board 6. The electrical socket 100 comprises an insulative housing 1, an optical module 3 and a plurality of electrical contacts 2 received in the insulative housing 1. The electrical contacts 2 are made of metal to transmit electrical signals. The optical module 3 comprises a plurality of optical members 4 to transmit optical signals. The optical member 4 is made of material that can transmit light such as glass or fiber et al. In this embodiment, the optical module 3 is assembled to the insulative housing 1. Alternative, the optical module 3 also could be integrated with the insulative housing 1 via insert molding.

Figure 5:
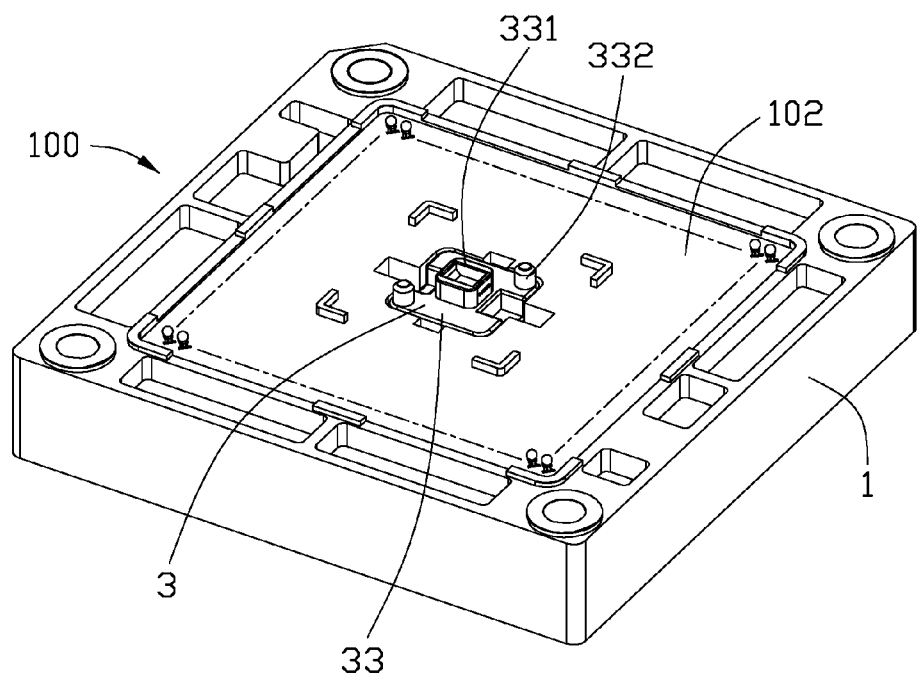
FIG. 5 is a bottom view of the electrical socket shown in FIG. 4.

Referring to FIG. 1 and FIG. 5, the insulative housing 1 comprises a bottom wall 10 and four sidewalls 11 extending upwardly from the bottom wall 10. The bottom wall 10 and the sidewalls 11 together form a receiving space 110 for receiving the IC package 5. The bottom wall 10 comprises a top surface 101, a bottom surface 102 opposite to the top surface 101. The bottom wall 10 also comprises a plurality of passageways 1010 and a window 103 impenetrating the top surface 411 and the bottom surface 412. The bottom wall 10 also comprises a plurality of recesses 104 depressed from the top surface 101 to the interior of the bottom wall 10. The recesses 104 are communicated with the window 103. The bottom wall 10 comprises a pair of blocks 105 extending to the recess 104. The electrical contacts 2 are received in the passageways 1010 and each comprises a body portion 22, a contact portion 21 extends upwardly from the body portion 22 and a tail 23 extends downwardly from the body portion 22.

Figure 3:
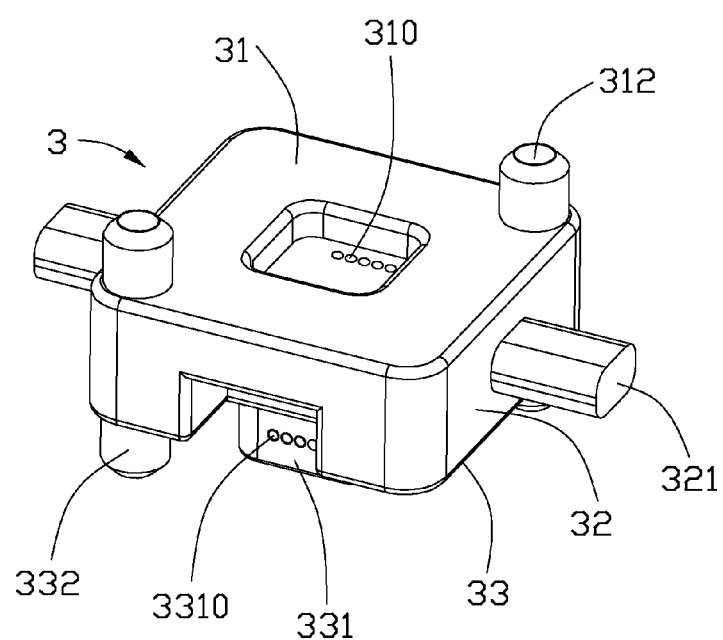
FIG. 3 is an isometric view of the optical module shown in FIG. 1.

Referring to FIGS. 1, 3 and 5, the optical module 3 comprises an upper surface 31, a lower surface 33 opposite to the upper surface 31 and four side surfaces 32 connecting the upper surface 31 and the lower surface 33. The optical module 3 also comprises a first post 312 extending upwardly from the upper surface 31, a positioning member 321 extending from the side surface 32, a second post 332 and a protrusion 331 extending downwardly from the lower surface 33. The optical module 3 comprises a plurality of upper lenses 310 extending upwardly from the upper surface 31, and a plurality of lower lenses 3310 extending from the side of the protrusion 331. Referring to FIG. 6, the protrusion 331 of the optical module 3 locates in the hole 61 of the printed circuit board and thus laterally and horizontally overlapped with the printed circuit board, the upper lenses 310 aligning to the IC package 5, the lower lenses 3310 aligning to the printed circuit board 6, and the lower lens 3310 aligning to the upper lens 3310 to establish light path to transmit optical signal.

Figure 4:
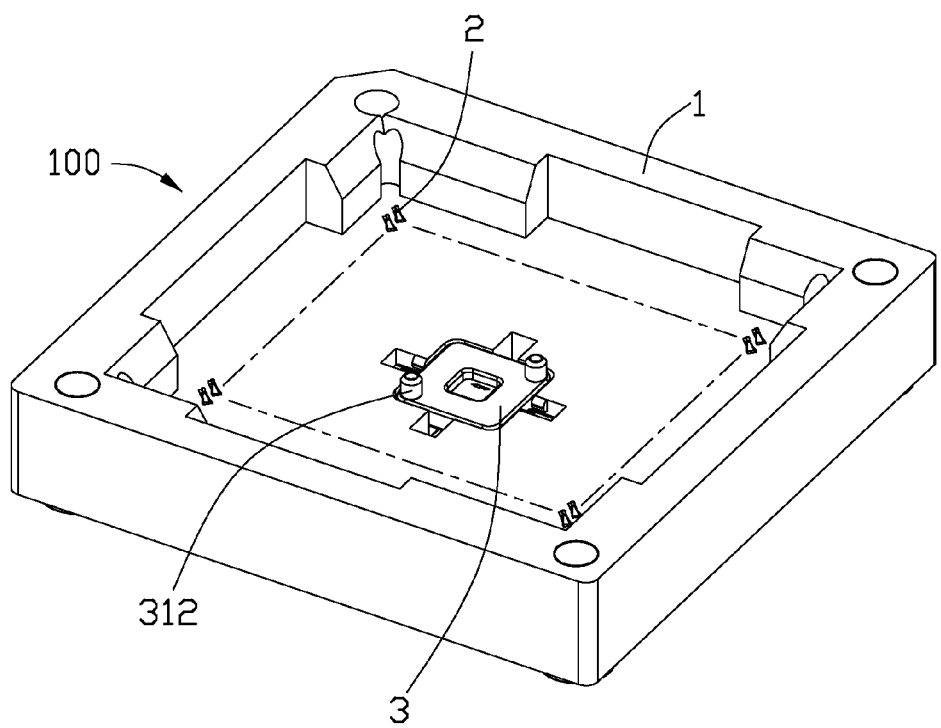
FIG. 4 is an assembled view of the electrical socket shown in FIG. 1.

Referring to FIGS. 4-6, the electrical contacts 2 are secured to the insulative housing 1 to transmit electrical signals. The body portion 22 is received in the passageways 1010, the contact portion 21 locates in the receiving space 110 to connect with the IC package 5, and the tail 23 locates beyond the bottom surface 102 to connect with the printed circuit board 6. The optical module 3 is received in the window 103 of the insulative housing 1. The positioning member 321 is received in the recess 104 of the insulative housing 1 and interlocks with the blocks 105 to position the optical module 3 in the insulative housing 1. The first post 312 can project into the IC package 5 to ensure the upper lens 310 aligning with the IC package 5. The second post 312 is inserted in the printed circuit board 6 to ensure the lower lens 3310 aligning with the printed circuit board 6.

Figure 7:
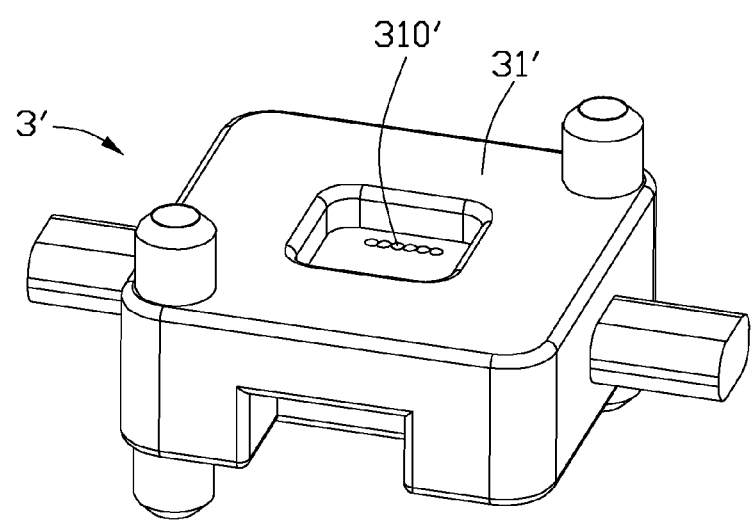
FIG. 7 is an isometric view of another embodiment of the optical module shown in FIG. 3.
Figure 8:
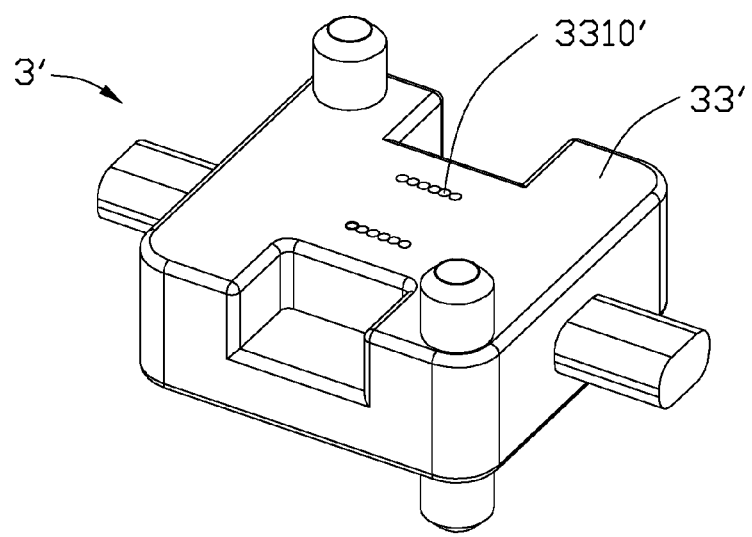
FIG. 8 is a bottom view of the optical module shown in FIG. 7.

FIGS. 7-8 show another embodiment of the optical module 3'. The difference with the above embodiment is the lower lenses 3310' are set on the lower surface 33'. The optical module 3' is assembled to the upper surface of the printed circuit board 6.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical socket used to connecting an IC package and a printed circuit board, comprising:
    an insulative housing with a plurality of electrical contacts received therein to transmit electrical signals; and
    an optical module arranged on the insulative housing and comprising a plurality of optical members to transmit optical signal;
    wherein the insulative housing comprises a bottom wall with a top surface and a bottom surface opposite to each other;
    wherein the bottom wall comprises a window impenetrating the top surface and the bottom surface and the optical module is received in the window.

2. The electrical socket as claimed in claim 1, wherein the optical module comprises an upper surface and a lower surface opposite to the upper surface, and a first post and a plurality of upper lenses extend upwardly from the upper surface.

3. The electrical socket as claimed in claim 2, wherein the optical module comprises a second post and a plurality of lower lenses extending downwardly from the lower surface, each lower lens aligning to a corresponding upper lens to establish a light path to transmit optical signal.

4. The electrical socket as claimed in claim 3, wherein the optical module comprises a protrusion extending downwardly from the lower surface and the lower lenses are located on the side of the protrusion.

5. The electrical socket as claimed in claim 1, wherein the bottom wall defines a plurality of recesses depressed from the top surface to the interior of the bottom wall.

6. The electrical socket as claimed in claim 5, wherein the bottom wall comprises a pair of blocks extending to the recess.

7. The electrical socket as claimed in claim 6, wherein the optical module comprises a positioning member located in the recess and interlocking with the blocks.

8. An electrical socket assembly, comprising:
    a printed circuit board;
    an insulative housing mounted on the printed circuit board;
    a plurality of electrical contacts received in the insulative housing to transmit electrical signal;
    an optical module arranged on the insulative housing and comprising a plurality of optical members to transmit optical signal; and
    an IC package mounted on the insulative housing; wherein
    the optical module comprises a plurality of upper lenses corresponding to the IC package and a plurality of lower lenses corresponding to the printed circuit board, the lower lens aligning to the upper lens to establish light path to transmit optical signal.

9. The electrical socket assembly as claimed in claim 8, wherein the printed circuit board comprises a hole, and the optical module comprises a protrusion located in the hole.

10. The electrical socket assembly as claimed in claim 9, wherein lower lenses are set on the protrusion.

11. The electrical socket assembly as claimed in claim 8, wherein the insulative housing comprises a bottom wall, a window impenetrating the bottom wall, a recess communicates with the window and a block extending to the recess.

12. The electrical socket assembly as claimed in claim 11, wherein the optical module is received in the window and comprises a positioning member located in the recess and interlocking with the block.

13. A socket assembly for coupling an IC package and a printed circuit board, comprising:
    an insulative housing configured for retaining the IC package and defining top and bottom faces wherein the top face is adapted for confronting the IC package and the bottom face is adapted for confronting the printed circuit board;
    a plurality of electrical contacts disposed in the housing and extending between the top face and the bottom face for electrically connecting the IC package and the printed circuit board; and
    at least one optical module corresponding to the housing for correct alignment with the IC package and optically connecting the IC package and the printed circuit board; wherein
    the optical module is located between the top face and the bottom face for coupling to the IC package and the printed circuit board, respectively; wherein
    the optical module further extends downwardly beyond the bottom face for being overlapped with the printed circuit board horizontally.

14. The socket assembly as claimed in claim 13, wherein said printed circuit board defines a through hole in which a protrusion of the optical module is received.

15. The socket assembly as claimed in claim 14, wherein, the optical module includes a plurality of lower lenses formed on one side of the protrusion and located in the through hole.

16. The electrical socket assembly as claimed in claim 8, wherein the optical module includes upper and lower surfaces.

17. The electrical socket assembly as claimed in claim 16, wherein the upper lenses are located upon the upper surface and the lower lenses are located upon the lower surface corresponding to the upper lenses to establish said light path.

18. The electrical socket assembly as claimed in claim 16, wherein at least one post extends upward from the upper surface for alignment with the IC package.

19. The electrical socket assembly as claimed in claim 16, wherein at least one post extends downward around the lower surface for alignment with the printed circuit board.

20. The electrical socket assembly as claimed in claim 8, wherein said upper lens aligning to the corresponding lower lens is made by an optical member reflecting light between the upper lens and the lower lens.

* * * * *